United States Patent [19]

Barhorst

[11] 3,999,034
[45] Dec. 21, 1976

[54] SQUARE WAVE WELDING SYSTEM
[75] Inventor: Ralph E. Barhorst, Troy, Ohio
[73] Assignee: Hobart Brothers Company, Troy, Ohio
[22] Filed: June 2, 1975
[21] Appl. No.: 582,753
[52] U.S. Cl. .............................. 219/131 R; 219/135
[51] Int. Cl.² .......................................... B23K 9/10
[58] Field of Search .......... 219/69 C, 137 PS, 135, 219/131 R, 131 WR, 131 F; 321/18

[56] References Cited
UNITED STATES PATENTS

| | | | |
|---|---|---|---|
| 2,951,930 | 9/1960 | McKechnie | 219/69 C |
| 3,300,683 | 1/1967 | Weishaar | 219/137 PS |
| 3,330,933 | 7/1967 | Maklary | 219/131 R |
| 3,528,100 | 9/1970 | Budy | 219/131 R |
| 3,688,180 | 8/1972 | Chiasson et al. | 219/135 |
| 3,902,037 | 8/1975 | Goto et al. | 219/135 |

FOREIGN PATENTS OR APPLICATIONS 292,742  1/1971  U.S.S.R. ..................... 219/131 WR

Primary Examiner—J. V. Truhe
Assistant Examiner—Clifford C. Shaw
Attorney, Agent, or Firm—Biebel, French & Nauman

[57] ABSTRACT

A square wave welder includes two regulated constant current power supplies which are alternately connected to a welding electrode. The on time and current of each power supply are independently adjustable. Switching is accomplished by means of gate controlled thyristors, and each power supply is either connected to the electrode or its output is short circuited in order to maintain the current flow at a substantially constant level to improve current regulation.

8 Claims, 5 Drawing Figures

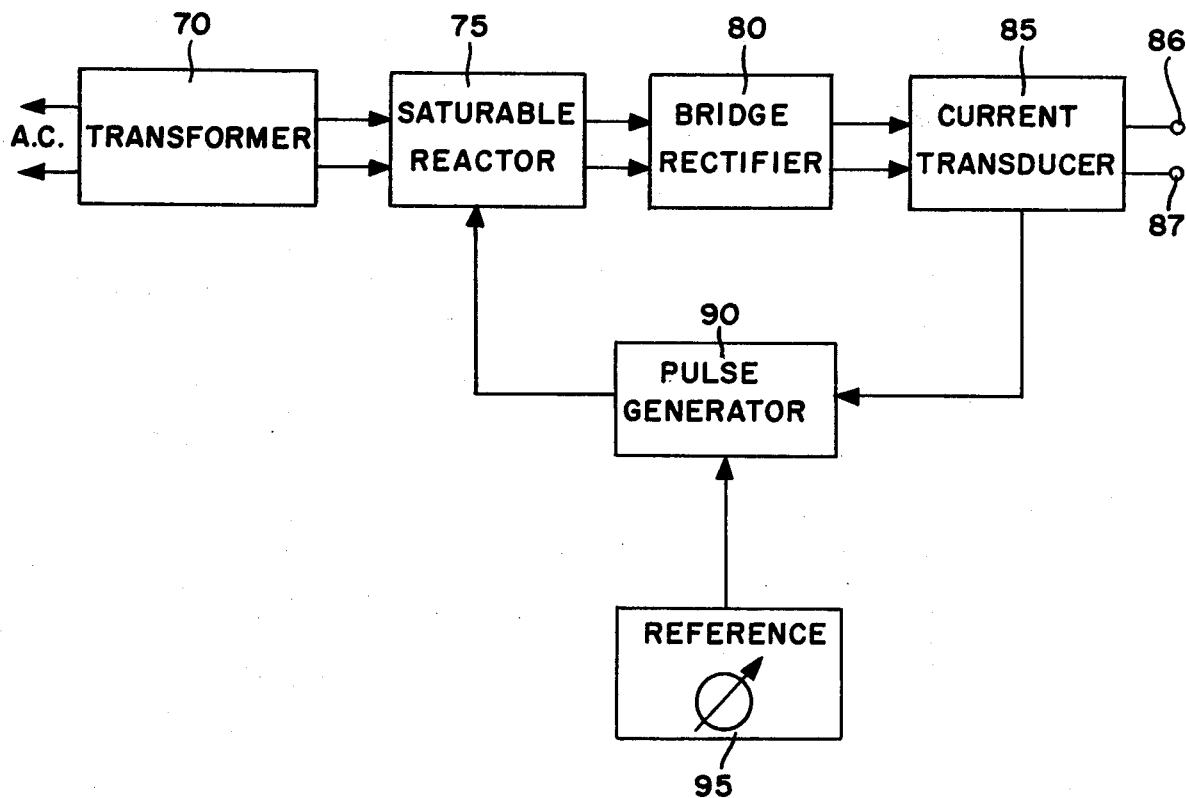

SQUARE WAVE WELDING SYSTEM

BACKGROUND OF THE INVENTION

This invention relates to a welding power supply system for use in inert gas arc welding, and has particular application to inert gas metal arc welding using nonconsumable electrodes, such as tungsten, commonly referred to as tungsten inert gas (TIG) welding, and is used in welding aluminum, aluminum alloys and similar metals.

The basic reasons for using square wave TIG welding are well known in the prior art, as described in U.S. Pat. Nos. 2,495,655; 22,951,930; 3,068,352; 3,300,683; 3,330,933; 3,349,219; 3,350,538; 3,528,100; 3,598,954 and 3,781,508; and British Pats. Nos. 732,230 and 732,403; and "IEEE Transactions on Industry and General Applications," November/December 1967.

The techniques shown in the above mentioned prior art include a single power supply connected to the arc directly or through an inverter; or dual power supplies connected to the arc through a control or switching circuit; or power supplies connected to the arc either directly or through an inverter with the output shunted to control welding current during the reverse polarity interval.

SUMMARY OF THE INVENTION

In the present invention, a welding power supply system includes a pair of regulated, constant current power supplies, the outputs of which are alternately connected to and disconnected from an arc circuit through switching means, such as silicon controlled rectifiers (SCRs).

Each power supply includes a control circuit to regulate and maintain its current output at a desired current level. Since the power supplies are alternately connected and disconnected from the arc circuit, additional switching means are provided to shunt the output of that power supply not connected to the arc circuit thereby maintaining a current path for control purposes; otherwise the power supply output would be uncontrolled, and when reconnected to the arc circuit, it may provide an undesirable surge of current causing arc instability, splatter, excessive heating, etc.

Also, the power supplies are independently adjustable; and therefore independent control is possible over straight polarity current, straight polarity time, reverse polarity current, and reverse polarity time. With the present invention, it is not required that the straight and reverse polarity current be the same, as with those prior devices using a single power supply and inverter.

Since the reverse current and time can be adjusted independently of the forward current and time, the size of the tungsten electrode may be decreased to approximately the same size as required for direct current, straight polarity welding while retaining the advantages of square wave alternating current welding.

The current requirements for the reverse polarity power supply may be less than that of the straight polarity power supply since the reverse polarity power supply is primarily for cleaning the material being welded. For example, when welding very clean aluminum, the reverse polarity power supply may be functional only 10 percent of the time while it may supply welding current 40 percent or more of the time when welding dirty materials. In a typical application, the straight polarity power supply will provide 300 amps current for 70% of a weld cycle time of 50 milliseconds, while the reverse polarity power supply will provide 150 amps current for 30% of the weld cycle time.

On the other hand, when welding thin materials at very low currents, the reverse polarity power supply may actually provide a higher current for a very short period of time. By way of example, thin materials, such as 0.020 inch aluminum, may be welded with 10 amps straight polarity power supply at 90% of a 50 millisecond weld cycle time, while the reverse polarity supply may provide 35 amps at 10 percent of the cycle time. Under these conditions, there is relatively little heating of the tungsten electrode during the reverse current part of the cycle, yet arc stability is maintained without requiring an auxiliary high frequency stabilizer.

The present invention is also capable of operating as a square wave direct current welder as well as a square wave alternating current welder merely by reversing the output terminals of the reverse polarity power supply.

It is therefore an object of this invention to provide an improved welding power supply system including first and second constant current power supply means having output terminals for connection to an arc circuit comprising a welding electrode and a workpiece, series connected switching means connected in series between each said power supply and the arc circuit, shunt connected switching means connected across the output of each said power supply, and control circuit means connected to said series switching means and said shunt switching means for alternately connecting one of said power supplies to the arc circuit while at the same time shunting the other said power supply thereby to maintain a substantially constant and continuous current through said power supplies.

It is a further object of the invention to provide an improved square wave welding power supply employing a pair of constant current power supplies wherein each power supply is maintained under a substantially constant load to maintain accurate and stable output current regulation regardless of whether or not it is connected to the arc circuit.

Other objects and advantages of the invention will be apparent from the following description, the accompanying drawings and the appended claims.

BRIEF DESCRIPTION OF THE DRAWINGS

FIG. 5 is an electrical block diagram of a regulated constant current power supply which may be used with the present invention.

DESCRIPTION OF THE PREFERRED EMBODIMENT

Figure 1:
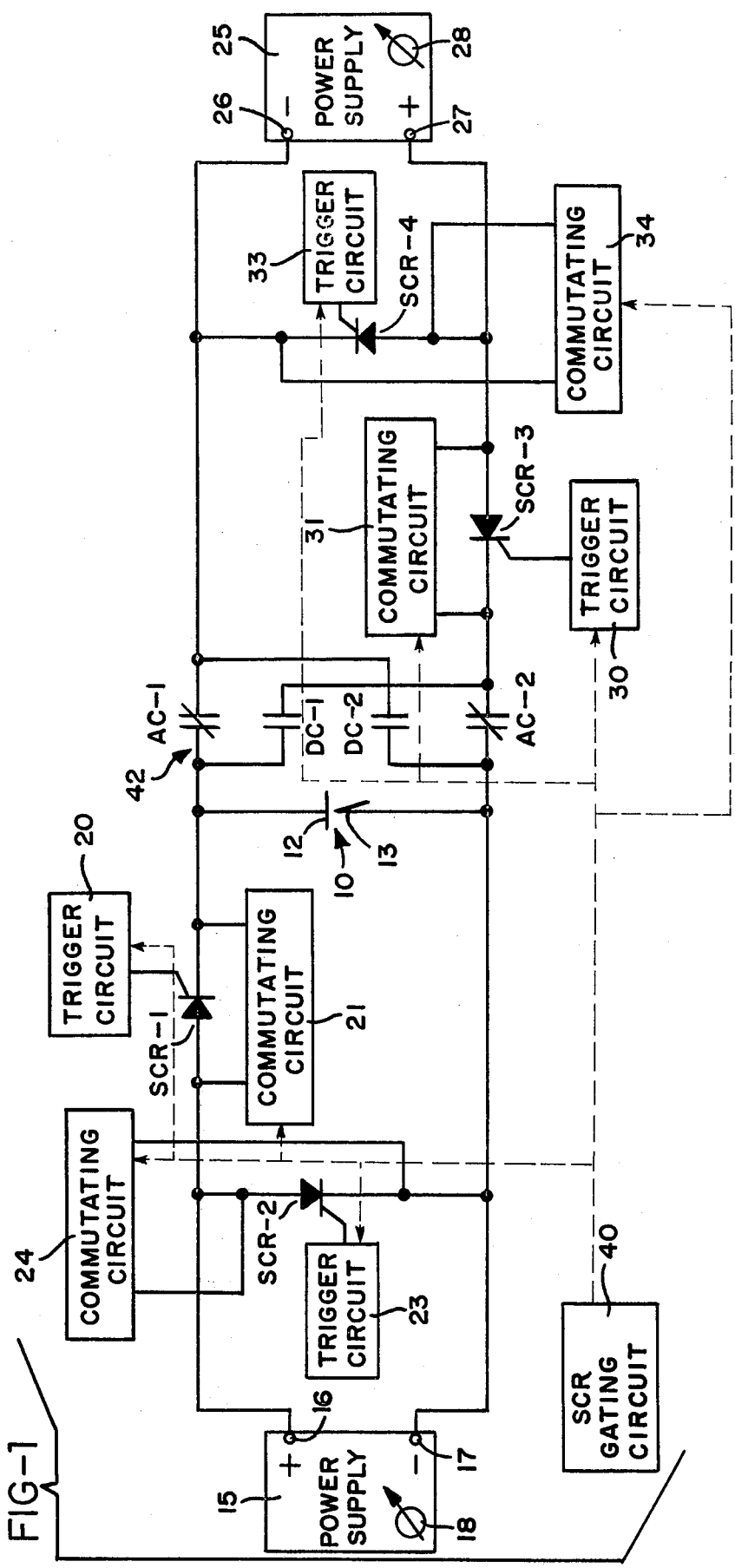
FIG. 1 is an electrical block diagram showing the general arrangement of the components which make up a preferred embodiment of the invention.

Reference is now made to FIG. 1 which is an electrical block diagram of a welding power supply system showing the relationship of the major components which comprise a preferred embodiment of the invention.

An arc circuit 10 includes a workpiece 12 and a welding electrode 13. The electrode 13 may be a tungsten electrode and the welding power supply system herein may be effectively used with the tungsten inert gas (TIG) welding process, although it is also useful in other welding processes, such as plasma welding.

The workpiece 12 and electrode 13 are supplied with welding current from a first constant current power supply 15 which has a positive output terminal 16 and a negative output terminal 17. The power supply 15 may draw power from a three phase commercial power line (not shown), and it produces an essentially constant, direct current output regardless of variations in output voltage and load resistance. The output current of the power supply 15 may be adjusted by means of knob 18. It is also contemplated that the power supply output current may be controlled by a programmer which would automatically adjust its output current to perform such functions as upslope, downslope, and weld taper. One constant current power supply which may be used in this invention is shown in U.S. Pat. No. 3,688,180, the disclosure of which is herein incorporated by reference.

Constant current power supply 15 is connected to and disconnected from the arc circuit 10 by a switching device which includes silicon controlled rectifier SCR1, shown in FIG. 1 connected between terminal 16 and the workpiece 12, a trigger circuit 20 and a commutating circuit 21. Connected across terminals 16 and 17 is a second or shunt switching device, which, as shown in FIG. 1, is a silicon controlled rectifier SCR2, trigger circuit 23 and commutating circuit 24.

Also connected to the workpiece 12 and electrode 13 is a second constant current power supply 25 which includes output terminals 26 and 27 and output current control 28. Power supply 25 is similar in design and function to power supply 15 although the maximum output current from this power supply may not, in some applications, need to be as great as that of power supply 15.

Power supply 25 is connected to and disconnected from the arc circuit 10 by a series switching device which includes silicon controlled rectifier SCR3, trigger circuit 30 and commutating circuit 31. SCR4 is connected to shunt the output of terminals 26 and 27, and is controlled by trigger circuit 33 and commutating circuit 34.

Each of the trigger circuits 20, 23, 30 and 33, as well as the commutating circuits 21, 24, 31 and 34, are controlled by means of an SCR gating circuit 40. This circuit will, as explained in detail hereinafter, control the time each of the power supplies 15 and 25 are connected to the arc circuit 10. By way of brief explanation, the gating circuit 40 will connect the power supply 15 to the arc circuit 10 by gating SCR1 into the conducting state, and at the same time it will cause the series connected switch SCR3 to disconnect the second power supply means 25. Simultaneously, shunt connected SCR2 will be gated off and SCR4 will be gated into conduction.

After a specified time interval, determined by gating circuit 40, power supply 15 will be disconnected from the arc circuit 10 by communicating SCR1 off; power supply 25 will be connected to the arc circuit by gating SCR3 on; and simultaneously, SCR2 will be gated into conduction while SCR4 will be turned off.

Power supply 15 has its positive terminal 16 connected to the workpiece 12 while power supply 25 has its negative terminal 26 connected to the workpiece 12 through the AC-1 contact of switch 42. The AC-2 contact connects the electrode 13 to the positive terminal 27. For some welding applications, such as out of position welding of aluminum or steel, it is desirable to have both power supplies connected to the arc circuit with the same polarity, and for this purpose, contacts DC1 and DC2 will be closed while contacts AC-1 and AC-2 will be opened.

Both power supplies 15 and 25 are direct current power supplies and are connected to the arc circuit through gated controlled thyristors or silicon controlled rectifiers. In order to gate the SCRs off, commutating circuits 21, 24, 31 and 34 are connected across each of the series connected switches SCR1 and SCR3 as well as the shunt connected switches SCR2 and SCR4. A typical commutating circuit is shown in FIG. 2.

The commutating circuit includes a transformer T1 having its primary winding connected to a source of alternating current and a secondary winding connected to a bridge rectifier BR1, the output of which is a pulsating DC voltage which is partially filtered by capacitor C1. A commutating capacitor C2 will charge through charging resistor R1 to the DC supply voltage.

Figure 2:
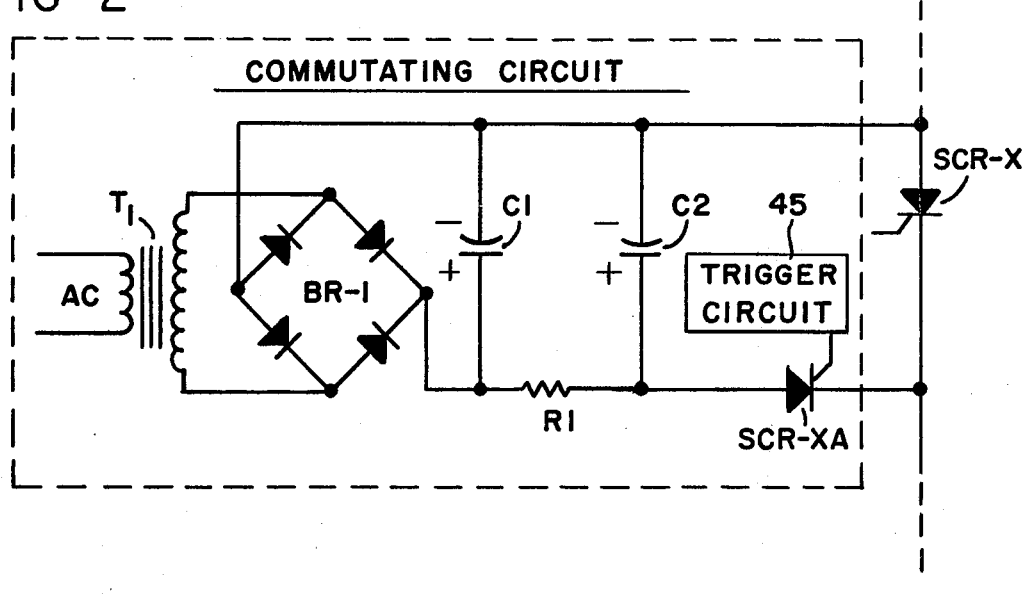
FIG. 2 is an electrical schematic diagram of one of several commutating circuits.

In FIG. 2, the power switching devices SCR1 - SCR4 are represented by SCR-X, and it is assumed that this SCR is in the conducting state. As is well known, an SCR will not cease conducting unless the current through the SCR is terminated or reduced below a predetermined level for a specified period of time; and this may be done by gating a commutating switching device SCR-XA into conduction by trigger circuit 45, thereby placing the commutating capacitor C2 directly across SCR-X, reversing or reducing to zero the polarity across SCR-X for a time sufficient to allow it to cease conducting. The commutating capacitor C2 will discharge rapidly through the commutating switch SCR-XA, and when the capacitor C2 discharges sufficiently, SCR-XA will also cease to conduct. Thereafter, a commutating capacitor C2 will again charge to the DC supply voltage.

The actual values of the resistance R1 and the capacitor C2 will vary depending upon the magnitude of the welding current through SCR-X and the type of device used as well as the frequency at which the power SCRs are gated on and off.

Figure 3:
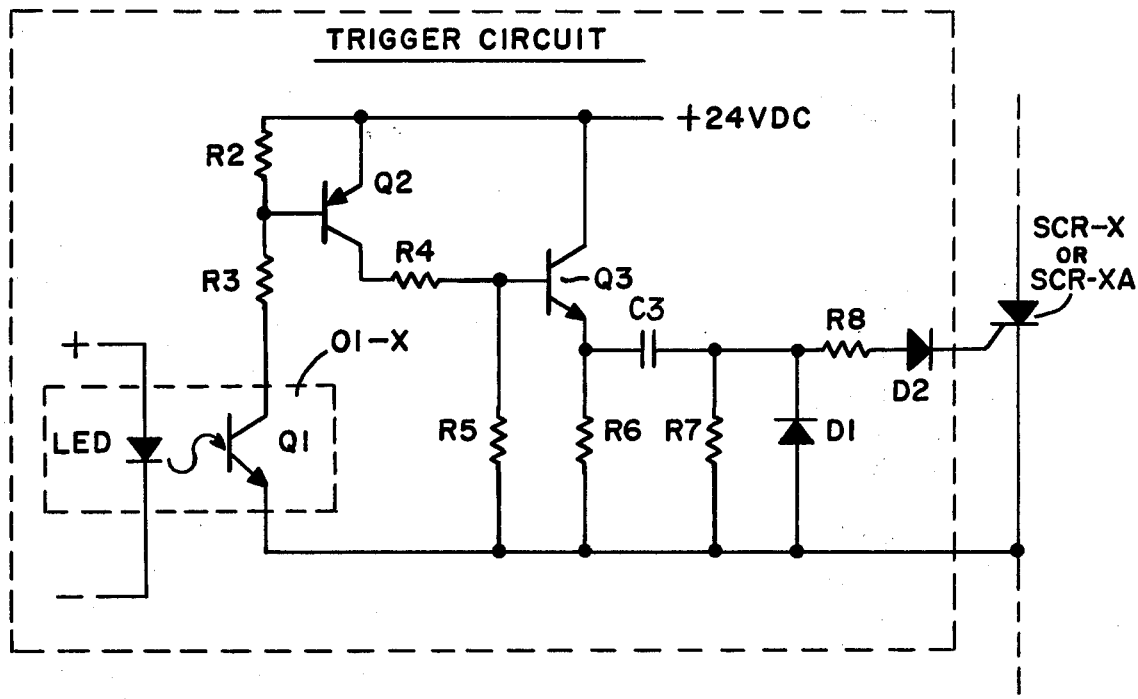
FIG. 3 is an electrical schematic diagram of one of several trigger circuits.

The power SCRs, SCR1 - SCR4, as well as the corresponding commutating SCRs, SCR1A - SCR4A are gated into conduction by means of trigger circuits, one of which is shown in FIG. 3. The trigger circuits are provided with a square wave pulse from the control of SCR gating circuit 40. This pulse is applied to an optical isolator device OIX.

There are 8 trigger circuits employed in the present invention, one for each of the 4 power SCRs, SCR1 - SCR4, and the four commutating SCRs, SCR1A - SCR4A; and each SCR is gated on by operation of the corresponding optical isolator OI1 - OI4 and OI1A - OI4A.

The pulse to operate the optical isolator OIX is applied to a light emitting diode LED which in turn causes a phototransistor Q1 to conduct current. This in turn causes current to flow through resistors R2 and R3, lowering the voltage on the base of transistor Q2, thereby causing it to conduct; and this will cause the transistor Q3 to conduct. A differentiating circuit consisting of capacitor C3 and resistors R7 and R8 will apply a pulse of sufficient duration and amplitude to the gate electrode of either the power or commutating SCR to cause it to begin conducting.

When the input pulse is removed from the optical isolator, transistors Q2 and Q3 will cease conducting and capacitor C3 will discharge through resistor R6 and diode D1.

It is understood that the trigger circuit shown in FIG. 3 is typical of many circuits which may be used to control the gating voltage of the power and commutating SCRs. The following table lists typical values for the components which make up the trigger circuit shown in FIG. 3.

TABLE I

| R2 | 4.7K ohm | C3 | 3 mfd |
|---|---|---|---|
| R3 | 1K | | |
| R4 | 270 | D1 | 1N4004 |
| R5 | 2.7 | D2 | 1N4004 |
| R6 | 1K | Q2 | 2N3906 |
| R7 | 680 | Q3 | 2N4921 |
| R8 | 10 | OIX | 4N26 |

Figure 4:
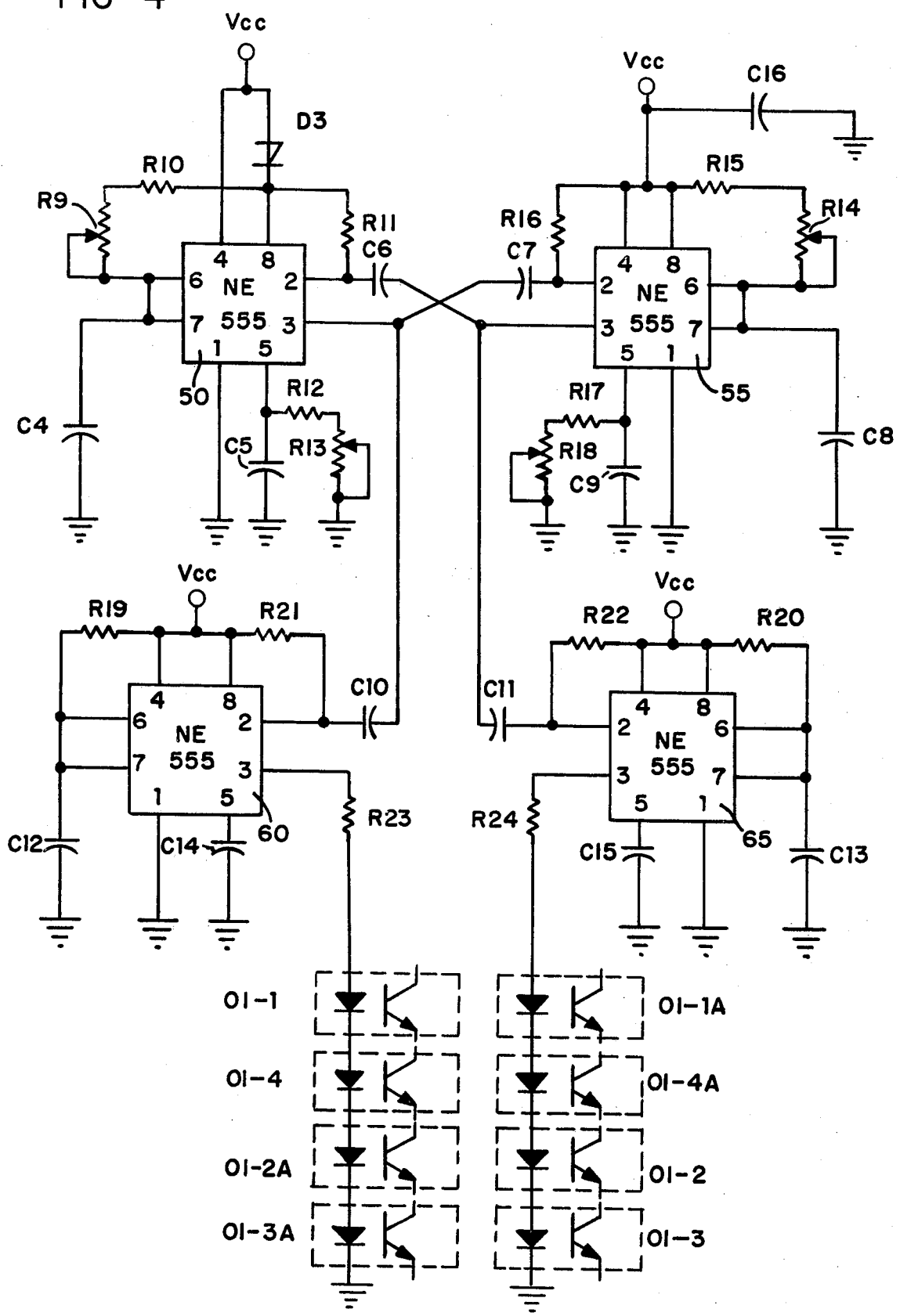
FIG. 4 is an electrical schematic diagram of the main control or SCR gating circuits.

The control of SCR gating circuit shown in FIG. 4 for gating each of the SCRs into conduction includes two timer circuits which cooperate with each other in a flip-flop type arrangement, whereby the on time of the SCRs which they control may be adjusted between 2 milliseconds and 1 second, and two other timer circuits which act primarily as pulse shapers to insure that the duration of the gating pulse is sufficient to gate the SCRs into conduction.

Timers 50 and 55 are shown as type NE555 timers manufactured by Signetics and are connected in a flip-flop type arrangement. Timer 55 controls the duration of the straight polarity pulse, or the output of power supply 15, while timer 50 controls the duration of the reverse polarity pulse, or the output of the power supply 25. Supply voltage Vcc, typically 15 volts, is supplies directly to pin 4 of the timer 50 and to pin 8 through a four layer diode D3. The four layer diode is employed during initial power turn on and will prevent the supply voltage from being applied to the timer 50 until the supply voltage exceeds twelve volts.

The timer output on pin 3 is controlled by an R-C circuit which includes capacitor C4, potentiometer R9 and resistor R10.

When capacitor C4 charges through R9 and R10 to approximately ⅔ Vcc, this will be sensed at pin 6, and the output of the timer on pin 3 will trasition from high to low. Pin 7 will short capacitor C4 in preparation for the next timing cycle.

When the output on pin 3 transition from high to low, this will be reflected through capacitor C7 to the trigger input, pin 2, of timer 55; the output on pin 8 of timer 55 will transition from low to high, the short will be removed from pin 7 of that timer allowing its timing capacitor C8 to charge through potentiometer R14 and resistor R15. When the voltage on C8 reaches approximately ⅔ the Vcc, the output on pin 3 of timer 55 will transition from high to low, and this will be reflected through capacitor C6 to the trigger input of timer 50. At the same time, pin 7 will shunt capacitor C8 in preparation for the next timing cycle. Thus, the timers 50 and 55 will alternately operate, with each timer operating for a time period determined by its respective RC circuit. These timers are easily adjusted by the operator by setting of potentiometers R9 and R14.

The circuits connected to pin 5 of timers 50 and 55, which include resistors R12 and R13 and capacitor C5 and resistors R16, R17 and capacitor C9, and for calibration control.

The outputs of timers 50 and 55 are connected through capacitors C10 and C11 to timers 60 and 65 which function as pulse forming circuits, the outputs of which are pulses of fixed duration, typically 1.2 milliseconds. The pulse duration of these circuits is controlled by resistor R19 and capacitor C12 for timer 60 and by resistor R20 and capacitor C13 for timer 65. The output of timer 60 is applied through resistor R23 to four optical isolators OI1, OI4 and OI2A and OI3A. Similarly, the output of timer 65 is connected through resistor R24 to optical isolators OI2, OI3, OI1A and OI4A.

The following table lists typical values for the components which are used in the circuit as shown in FIG. 4:

TABLE II

| R9, R14 | 500K Potentiometer |
|---|---|
| R10, R15 | 1K |
| R11, R16 | 27K |
| R12, R17 | 22K |
| R13, R18 | 50K |
| R19, R20 | 120K |
| R21, R22 | 2.7K |
| R23, R24 | 680 |
| C4, C8 | 2.2 mfd |
| C5, C9, C12, C13, C14, C15 | 0.01 mfd |
| C6, C7, C10, C11 | 0.001 mfd |
| C16 | 0.1 mfd |
| D3 | 1N5160 |

Reference is now made to FIG. 5 which is a block diagram of a regulated constant current power supply which may be used in this invention. This power supply is more completely described in U.S. Pat. No. 3,688,180 and includes a main welding transformer 70 having its primary winding connected to a commercial source of alternating current and its output connected through a current control device, such as saturable reactor 75, to a bridge rectifier 80. The direct current output of the bridge rectifier passes through a current transducer 85 to output terminals 86 and 87.

The output of the current transducer 85 is a signal related to welding current, and this signal is applied to a pulse generator 90 and compared against a reference established by an adjustable reference means 95. The reference is adjusted by the operator to set the output current level of the power supply. An output from the pulse generator 90 is preferably a pulse having a repetition rate related to the frequency of the alternating current source and a pulse width which determines the output current from the saturable reactor.

As explained in the above mentioned patent, the output of the pulse generator controls the operation of silicon controlled rectifiers which n turn control the average current flowing through a control winding of the saturable reactor 75.

A Power supply of this type continuously senses the output current, and a comparison is made of a signal representing that current to a reference, and a control signal is generated in response to that comparison to bring the output current to the desired level. Thus, any changes in the output current will be sensed immediately, and a correcting signal will be applied to bring the current to the desired level.

It is therefore apparent that the stability of the output of such a power supply is enhanced by maintaining its output current at a substantially constant level, whether or not the output is actually connected to the arc circuit because, if the output were disconnected from the arc circuit without providing a substitute load, no current would flow through the current transducer and the pulse generator 90 would provide an output which would tend to cause a maximum current output from the saturable reactor; and therefore, when the output is again connected to the arc circuit, a surge of current would flow for whatever time was necessary for the control circuit to bring the current back down to the desired level. Depending on the inductance of the saturable reactor, this time may be a substantial fraction of the weld cycle time.

Because the current output of the power supply when connected to the arc circuit is substantially the same as the current output when the power supply is connected to the shunt load, very little, if any, time is required to stabilize the power supply output current at the desired level each time the power supply is connected to the arc circuit, thus permitting relatively high switching rates to be used.

While the form of apparatus herein described constitutes a preferred embodiment of this invention, it is to be understood that the invention is not limited to this precise form of apparatus, and that changes may be made therein without departing from the scope of the invention which is defined in the appended claims.

What is claimed is:

1. A welding power supply system including
   first and second regulated, constant current power supply means each having output terminals for connection to an arc circuit comprising an electrode and a workpiece, each power supply including a current control circuit including.
     means for sensing the output current of said power supply,
     means for comparing said output current to a reference and for providing a control signal in response to said comparison,
     and means for controlling the output current of said power supply in response to said control signal whereby said power supply provides a substantially constant current output under dynamic operating conditions,
   series switching means connected between each power supply means and said arc current,
   shunt connected switching means connected across the output of each power supply means, and
   control circuit means connected to control the operation of said series switching means and said shunt switching means for selectively connecting one of said power supplies to said arc circuit and for shunting the output of the other said power supply thereby to maintain a substantially constant and continuous current output from said power supplies for improved current regulation thereof.

2. The welding power supply system of claim 1 wherein the output current of said constant current power supplies are independently adjustable.

3. The welding power supply system of claim 1 wherein the time each said constant current power supply is connected to said arc circuit is independently adjustable.

4. The welding power supply system of claim 1 wherein said constant current power supplies are of the same polarity when connected to the arc circuit.

5. The welding power supply system of claim 1 wherein said constant current power supplies are of opposite polarities when connected to the arc circuit.

6. A welding power supply system including
   first and second regulated, constant current power supply means each having output terminals for connection to an arc circuit comprising an electrode and a workpiece, each power supply including
     an alternating current transformer having a primary winding connected to a source of alternating current and a secondary winding connected to rectifier means for converting alternating current to direct current,
     means for sensing the output current of said power supply,
     means for comparing said output current to a reference and for providing a control signal in response to said comparison,
     and means for controlling the output current of said power supply in response to said control signal whereby said power supply provides a substantially constant current output under dynamic operating conditions,
   series switching means connected between each power supply means and said arc current,
   shunt connected switching means connected across the output of each power supply means, and
   control circuit means connected to control the operation of said series switching means and said shunt switching means for selectively connecting one of said power supplies to said arc circuit and for shunting the output of the other said power supply thereby to maintain a substantially constant and continuous current output from said power supplies for improved current regulation thereof.

7. The welding power supply system of claim 6 wherein said control circuit means includes first and second timer means each having a timed output which is independently adjustable as to duration, said timer means being innerconnected so that the beginning of the timed output of one timer means is initiated by the conclusion of the timed output of the other timer means.

8. The welding power supply system of claim 6 wherein the output current level of each of said first or second power supply means is adjustable independently of the output of the other said power supply means.

* * * * *